(12) United States Patent  
Lu

(10) Patent No.: US 11,980,020 B2  
(45) Date of Patent: May 7, 2024

(54) SEMICONDUCTOR STRUCTURE AND FORMING METHOD THEREOF

(71) Applicant: CHANGXIN MEMORY TECHNOLOGIES, INC., Hefei (CN)

(72) Inventor: Yong Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 129 days.

(21) Appl. No.: 17/469,328

(22) Filed: Sep. 8, 2021

(65) Prior Publication Data

US 2021/0408006 A1   Dec. 30, 2021

Related U.S. Application Data

(63) Continuation of application No. PCT/CN2021/086462, filed on Apr. 12, 2021.

(30) Foreign Application Priority Data

Apr. 10, 2020   (CN) .......................... 202010279011.3

(51) Int. Cl.  
   *H10B 12/00* (2023.01)
(52) U.S. Cl.  
   CPC ......... *H10B 12/0335* (2023.02); *H10B 12/31* (2023.02)
(58) Field of Classification Search  
   CPC ... H01L 23/52; H01L 23/535; H01L 23/5222; H01L 23/5223; H01L 23/5226; H01L 28/90; H10B 12/0335; H10B 12/31; H10B 12/033; H10B 12/03; H10B 12/30  
   See application file for complete search history.

(56) References Cited

U.S. PATENT DOCUMENTS

| 6,218,308 | B1 | 4/2001 | Lou |
| 6,271,099 | B1 | 8/2001 | Lou |
| 7,153,727 | B2 | 12/2006 | Lee et al. |

(Continued)

FOREIGN PATENT DOCUMENTS

| CN | 88101174 A | 12/1988 |
| CN | 1518112 A | 8/2004 |

(Continued)

OTHER PUBLICATIONS

First Office Action of CN application No. 202010279011.3, dated May 22, 2023.

(Continued)

*Primary Examiner* — Thanhha S Pham  
(74) *Attorney, Agent, or Firm* — Ladas & Parry LLP

(57) ABSTRACT

The present disclosure relates to the technical field of semiconductor manufacturing, and provides a semiconductor structure and a forming method thereof. The forming method includes: providing a semiconductor substrate, where a surface of the semiconductor substrate is provided with a plurality of conductive structures arranged at intervals; forming sidewall dielectric layers on surfaces of the conductive structures, and then depositing sequentially and alternately to form at least two supporting layers and sacrificial layers; etching the supporting layers and the sacrificial layers to form contact holes exposing the surfaces of the conductive structures; and forming an electrode layer on surfaces of the contact holes.

12 Claims, 4 Drawing Sheets

(56) References Cited

U.S. PATENT DOCUMENTS

| | | |
|---|---|---|
| 2003/0151083 A1 | 8/2003 | Matsui et al. |
| 2006/0141699 A1 | 6/2006 | Nam |
| 2008/0182378 A1* | 7/2008 | Gruening-von Schwerin ............ H01L 28/91 438/386 |
| 2009/0289292 A1 | 11/2009 | Park |
| 2014/0027924 A1 | 1/2014 | Lee |
| 2016/0343799 A1* | 11/2016 | Yi .................... H01L 21/76828 |

FOREIGN PATENT DOCUMENTS

| | | |
|---|---|---|
| CN | 1713368 A | 12/2005 |
| CN | 107910327 A | 4/2018 |
| CN | 108155152 A | 6/2018 |
| CN | 110504283 A | 11/2019 |
| CN | 110504284 A | 11/2019 |
| EP | 0282716 B1 | 9/1988 |
| JP | 2007134435 A | 5/2007 |

OTHER PUBLICATIONS

ISR for International Application PCT/CN2021/086462 dated Jul. 12, 2021.

Written Opinion for International Application PCT/CN2021/086462 dated Jul. 12, 2021.

* cited by examiner

SEMICONDUCTOR STRUCTURE AND FORMING METHOD THEREOF

CROSS-REFERENCE TO RELATED APPLICATION

This application is a continuation of International Patent Application No. PCT/CN2021/086462, filed on Apr. 12, 2021, which claims the benefit of priority to Chinese Patent Application No. 202010279011.3, filed on Apr. 10, 2020. The disclosures of the aforementioned patent applications are incorporated by reference in their entirety.

TECHNICAL FIELD

The present disclosure relates to the technical field of semiconductor manufacturing, in particular to a semiconductor structure and a forming method thereof.

BACKGROUND

As a commonly used semiconductor memory in computers, dynamic random access memory (DRAM) is composed of many repeated memory cells. Each memory cell typically includes a capacitor and a transistor. In the transistor, the gate is connected to the word line, the drain is connected to the bit line, and the source is connected to the capacitor. The voltage signal in the word line controls the transistor to turn on or off, and then the data information stored in the capacitor is read through the bit line, or data information is written through the bit line into the capacitor for storage. Wherein, the capacitor of the DRAM is electrically connected to the landing pad through the lower electrode thereof and forms an access path with the drain of the transistor.

With the shrinking of the feature size of the semiconductor integrated circuit devices, the requirements for the semiconductor manufacturing technology are becoming increasingly stringent. The contact resistance between the capacitor and the landing pad is excessive, and it may be reduced by increasing the cross-sectional area of the cylindrical capacitor or increasing the area of the landing pad. However, this method imposes extremely high requirements on the process technology, making it hard to control, and it may cause the risk of short circuit between two adjacent capacitors. Reducing the resistance between the capacitor and the landing pad and preventing two adjacent capacitors from short-circuiting due to the high temperature diffusion of tungsten has become a technical problem to be solved urgently. In view of this, the present disclosure innovates and optimizes the semiconductor manufacturing process flow to improve the structure of the landing pad and increase the contact area between the capacitor and the landing pad without increasing the size of the cylindrical capacitor.

SUMMARY

The present disclosure provides a forming method of a semiconductor structure. The forming method includes:
 providing a semiconductor substrate, where a surface of the semiconductor substrate is provided with a plurality of conductive structures arranged at intervals;
 forming sidewall dielectric layers on surfaces of the conductive structures, and then depositing sequentially and alternately to form at least two supporting layers and sacrificial layers;
 etching the supporting layers and the sacrificial layers to form contact holes exposing the surfaces of the conductive structures; and
 forming electrode layers on surfaces of the contact holes respectively.

Correspondingly, the present disclosure further provides a semiconductor structure. The semiconductor structure comprises:
 a semiconductor substrate, where a surface of the semiconductor substrate is provided with a plurality of conductive structures arranged at intervals, and the conductive structures protrude from the semiconductor substrate;
 sidewall dielectric layers, where the sidewall dielectric layers are formed on sidewalls of the conductive structures;
 a supporting layer, where the supporting layer is formed on the surface of the semiconductor substrate and surfaces of the conductive structures;
 contact holes, where the contact holes are located on a surface of the supporting layer and the contact holes expose the conductive structures; and
 electrode layers, where the electrode layers are respectively formed on surfaces of the contact holes.

REFERENCE NUMERALS

100. semiconductor substrate; 110. barrier layer; 200. conductive structure; 201. dielectric layer; 201a. sidewall dielectric layer; 101. first supporting layer; 102. second sacrificial layer; 103. third supporting layer; 104. fourth sacrificial layer; 105. fifth supporting layer; 300. contact hole; and 301. electrode layer.

DETAILED DESCRIPTION

To make the objectives, technical means and effects of the present disclosure clearer, the present disclosure is described in further detail below with reference to the accompanying drawings. It should be understood that the embodiments described herein are merely a part rather than all of the embodiments of the present disclosure, and are not intended to limit the present disclosure. All other embodiments obtained by those of ordinary skill in the art based on the embodiments of the present disclosure without creative work should fall within the protection scope of the present disclosure.

Step 1: A semiconductor substrate is provided, where a surface of the semiconductor substrate is provided with a plurality of conductive structures arranged at intervals.

Figure 1:
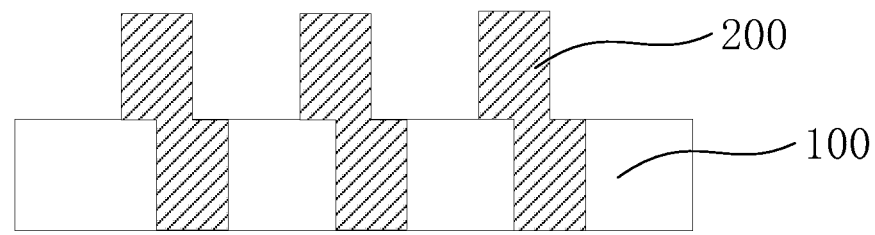
FIGS. 1 to 8 are schematic diagrams of structures obtained by sequentially implementing various steps in a forming method of a semiconductor structure according to an embodiment of the present disclosure.

Referring to FIG. 1, a semiconductor substrate 100 is provided. The semiconductor substrate 100 may include, but is not limited to, a monocrystalline silicon substrate, a polycrystalline silicon substrate, a gallium nitride substrate or a sapphire substrate. In addition, when the semiconductor substrate 100 is a monocrystalline substrate or a polycrystalline substrate, it may also be an intrinsic silicon substrate or a doped silicon substrate. Further, it may be an N-type polycrystalline silicon substrate or a P-type polycrystalline silicon substrate.

A surface of the semiconductor substrate 100 is provided with a plurality of conductive structures 200 arranged at intervals. The conductive structure 200 passes through the surface of the semiconductor substrate 100. The conductive structure 200 may be, but is not limited to, made of a conductive material such as tungsten and copper used in an integrated circuit.

Figure 2:
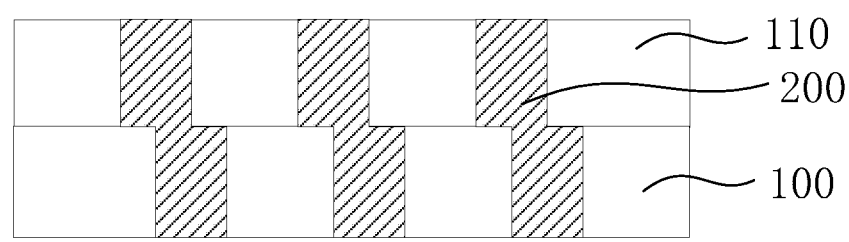
Figure 3:
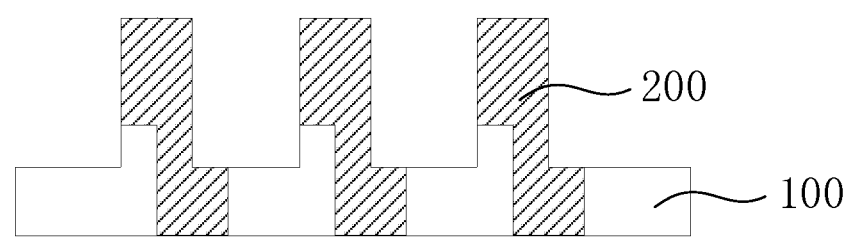

Further, referring to FIG. 2, a barrier layer 110 is deposited on the surface of the semiconductor substrate 100 and the surfaces of the conductive structures 200. Referring to FIG. 3, the semiconductor substrate 100 and a part of the conductive structures 200 are etched down along the barrier layer 110, such that a part of the semiconductor substrate wraps a part of the conductive structures to form isolation regions. In this implementation, the advantage of this process is that there is a layer of nitride between the tungsten structures to prevent the high temperature diffusion of tungsten from causing short circuit of two adjacent capacitors.

Further, the conductive structures 200 are located on the surface of the semiconductor substrate 100 and have an offset characteristic. This characteristic ensures that the bottom conductive structure can be connected, and also ensures the close-packed arrangement of capacitor openings, thereby increasing the capacitor density and increasing the storage capacity of the capacitor per unit area.

Figure 4:
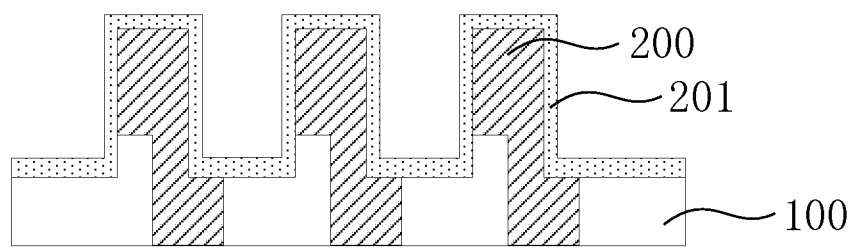

Step 2: Referring to FIG. 4, a dielectric layer 201 is formed on surfaces of the conductive structures 200.

Specifically, a dielectric layer 201 is formed on the surface of the semiconductor substrate 100 and the surfaces of the conductive structures 200. Those skilled in the art may understand that in the thin film deposition process, there are two main thin film deposition methods: chemical vapor deposition (CVD) and physical vapor deposition (PVD). CVD is a growth technology in which one or several substances in a gaseous state are activated in a certain way and undergo a chemical reaction on the surface of a substrate to deposit a desired solid thin film. PVD is a technology that uses a certain physical process to achieve the transfer of a substance, that is, to transfer atoms or molecules to the surface of a silicon substrate and deposit them into a thin film. Thin film deposition processes further include spin coating and electroplating, etc.

In this implementation, the dielectric layer 201 may be made by a vapor deposition process. The dielectric layer 201 may be made of titanium nitride. Specifically, the dielectric layer 201 may be formed by a mixed gas of titanium tetrachloride, nitrogen and hydrogen by vapor deposition. Alternatively, the dielectric layer 201 may be made of dititanium dinitride, which is obtained by heating titanium in nitrogen or ammonia at 900-1000° C. Alternatively, the dielectric layer 201 may be made of trititanium tetranitride, which is obtained by heating titanium tetrachloride in ammonia at 1000° C. According to material properties, the deposition thickness of the dielectric layer 201 may be 30-50 nm. Further, the dielectric layer 201 may also be formed on the surface of the semiconductor substrate 100 and the surfaces of the conductive structures 200 by electrochemical plating (ECP). The dielectric layer 201 may be made of titanium nitride. According to material properties, the deposition thickness of the dielectric layer 201 may be 30-50 nm.

The dielectric layer 201 is made of titanium nitride, which has a high melting point, a high hardness, a desirable high-temperature chemical stability, an excellent thermal and electrical conductivity, and it is suitable for the fields of high-temperature resistance and wear resistance. This implementation can prevent two adjacent capacitors from short-circuiting due to high temperature diffusion between the conductive structures 200, thereby improving the yield of the semiconductor structure in the semiconductor manufacturing process.

Figure 5:
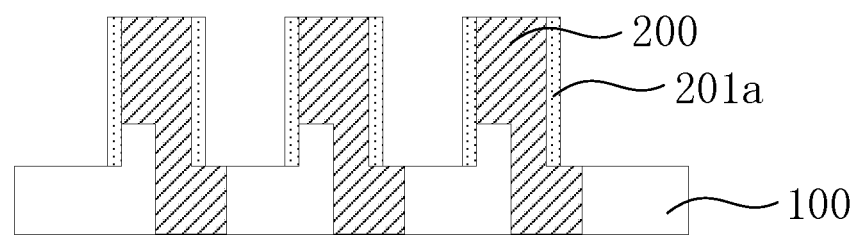

Step 3: Referring to FIG. 5, sidewall dielectric layers 201a of the conductive structures 200 are obtained by dry etching.

There are two basic etching processes in semiconductor manufacturing, namely dry etching and wet etching. Dry etching is a process that uses a plasma generated in a gaseous state to physically and chemically react with a silicon wafer exposed to the plasma through a masking layer window formed by photolithography so as to etch away a surface material exposed on the silicon wafer. Dry etching is used in fine etching of a small feature size in an advanced circuit. Dry etching uses gas as the main medium, such that the semiconductor material does not require a liquid chemical for treatment or flushing, and the semiconductor material enters and exits the system in a dry state. Compared with wet etching, dry etching shows chemical isotropy (etching in both vertical and horizontal directions) and physical anisotropy (single vertical etching).

Specifically, in this implementation, the dielectric layer 201 may be etched by a dry etching process, and only the sidewall dielectric layers 201a of the conductive structures 200 are retained. Specifically, the semiconductor structure is transferred into a reaction chamber, and the pressure in the reaction chamber is reduced by a vacuum system. After a vacuum state is reached, the reaction chamber is filled with a reactive gas. To etch titanium nitride, the reactive gas typically uses a mixture of nitrogen fluoride and oxygen. Alternatively, it may also use other fluorine (F)-containing gas as the etching gas, such as $CF_4$, $SF_6$ or $NF_3$. A power source creates a radio frequency (RF) field through an electrode in the reaction chamber. The energy field excites the mixed gas into a plasma state. In the excited state, the reactive fluorine etches, and the material is converted into a volatile component and discharged by a vacuum system. Further, in this implementation, the main component of the reactive gas used is nitrogen fluoride. By controlling the ratio of nitrogen ion to fluoride ion and the reaction time of the process are controlled. Finally, sidewall dielectric layers 201a are formed on the surfaces of the conductive structures 200.

Further, in this implementation, a wet etching process may also be used to etch away the dielectric layer 201 on the surfaces of the conductive structures 200 and the surface of the semiconductor substrate 100, retaining only the sidewall dielectric layers 201a. Since the dielectric layer 201 is nitride, diluted hydrofluoric acid (the ratio of hydrofluoric acid to water is 1:300) is used for etching. In this implementation, by wet etching, a precise etching pattern can be obtained, and the sidewall dielectric layers 201a can be well retained, so as to prepare for the subsequent step.

Those skilled in the art may understand that a capacitor of a dynamic random access memory (DRAM) is electrically connected to a landing pad through a lower electrode thereof and forms an access path with a drain of a transistor. In some structures with a landing pad, sidewall dielectric layers 201a are formed on the surfaces of the conductive structures 200, and the sidewall dielectric layers 201a serve as a capacitor electrode. The sidewall dielectric layers 201a are made of titanium nitride, which has a high melting point, a high hardness, a desirable high-temperature chemical stability, an excellent thermal and electrical conductivity, and it is suitable for the fields of high-temperature resistance and wear resistance.

The sidewall dielectric layers 201a enlarge the cross-sectional area of the conductive structures, thereby increasing the contact area between the capacitor and the landing pad and reducing the resistance there-between. Meanwhile, it can further prevent two adjacent capacitors from short-circuiting due to high temperature diffusion between the conductive structures 200. This implementation satisfies the technical requirements of the semiconductor process and is easy to operate. By increasing the contact area between the capacitor and the landing pad, this implementation can reduce the resistance between the capacitor and the landing pad without increasing the size of the cylindrical capacitor, and can also avoid short circuit between two adjacent capacitors due to high temperature diffusion between the conductive structures 200. Therefore, this implementation can improve the yield of the semiconductor structure in the semiconductor manufacturing process.

Figure 6:
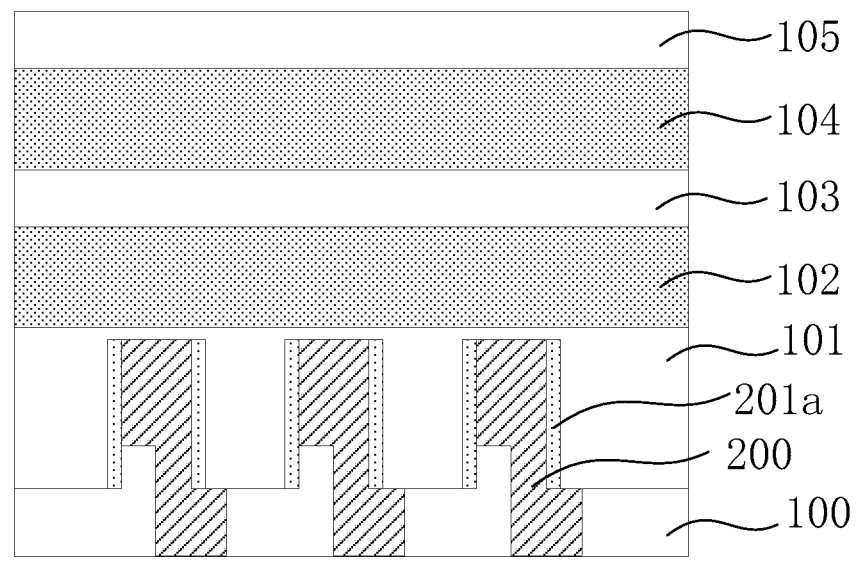

Step 4: Referring to FIG. 6, a supporting layer is formed on the surface of the semiconductor substrate 100 and the surfaces of the conductive structures 200.

Specifically, after the sidewall dielectric layers 201a are formed on the surfaces of the conductive structures 200, a first supporting layer 101, a second sacrificial layer 102, a third supporting layer 103, a fourth sacrificial layer 104 and a fifth supporting layer 105 are sequentially formed on the surface of the semiconductor substrate 100 and the surfaces of the conductive structures 200 by a deposition process. In this implementation, the specific deposition process of the first supporting layer 101 may vary. For example, the CVD process may be used to deposit a supporting layer 101 with a predetermined thickness distribution on the surface of the semiconductor substrate 100 and the surfaces of the conductive structures 200. Further, the control means for controlling the flow velocity of the introduced gas flow, controlling the flow rate of the introduced gas flow, controlling the deposition time or controlling the deposition temperature may be used alone. By improving the control accuracy of the gas flow and temperature, it can ensure that all atoms are arranged neatly during deposition to form a monocrystalline layer. Finally, a supporting layer 101 with a uniform thickness is formed on the surface of the semiconductor substrate 100 and the surfaces of the etched conductive structures 200. By means of the same deposition process, the second sacrificial layer 102 is deposited on a surface of the first supporting layer 101, the third supporting layer 103 is deposited on a surface of the second sacrificial layer 102, the fourth sacrificial layer 104 is deposited on a surface of the third supporting layer 103, and the fifth supporting layer 105 is deposited on a surface of the fourth sacrificial layer 104.

In the actual process, as the depth of the capacitor increases, the number of supporting layers increases. The present disclosure can realize a capacitor structure with a single supporting layer or two or more supporting layers. Meanwhile, according to actual process requirements, the sacrificial layer may be etched away.

Commonly used deposition materials include monocrystalline silicon, silicon oxynitride, silicon dioxide, silicon nitride and other insulating materials used for isolation. Therefore, the materials of the first supporting layer 101, the second sacrificial layer 102, the third supporting layer 103, the fourth sacrificial layer 104 and the fifth supporting layer 105 may include, but are not limited to, silicon dioxide, silicon nitride, silicon oxynitride, monocrystalline silicon, carbon and other related insulating materials used in an integrated circuit. For example, in this implementation, the first supporting layer 101 may be a silicon nitride layer, the second sacrificial layer 102 may be an oxide layer, the third supporting layer 103 may be a silicon nitride layer, the fourth sacrificial layer 104 may be an oxide layer, and the fifth supporting layer 105 may be a silicon nitride layer. In addition, according to material properties, the deposition thickness of the supporting layer and the sacrificial layer may be 30-120 nm (oxide layer) and 30-50 nm (silicon nitride layer).

Figure 7:
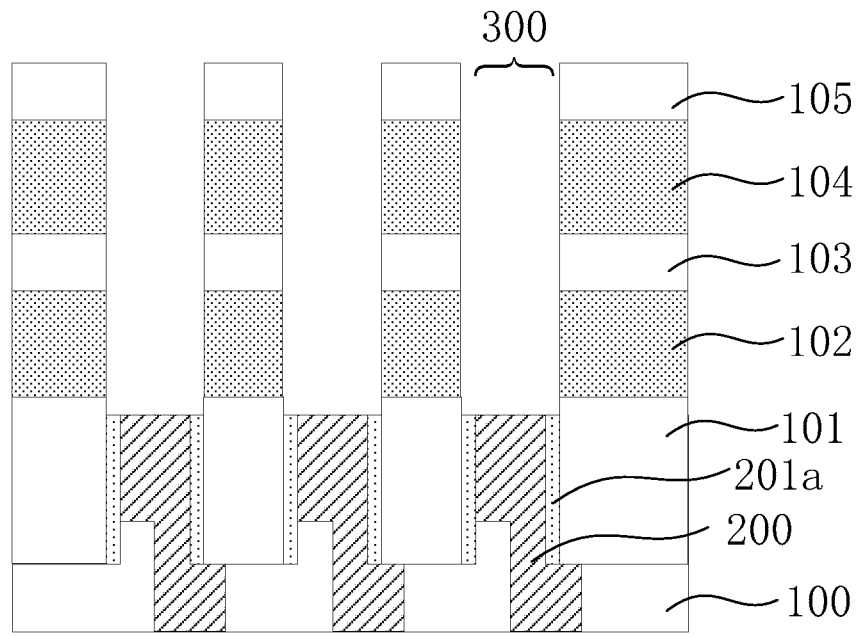

Step 5: Referring to FIG. 7, a semiconductor structure with contact holes structure is formed by an etching process. The forming method of a semiconductor structure is used to form a new type of structure with a landing pad.

Specifically, the first supporting layer 101, the second sacrificial layer 102, the third supporting layer 103, the fourth sacrificial layer 104 and the fifth supporting layer 105 are etched to form contact holes 300 exposing the surfaces of the conductive structures 200 and surfaces of the sidewall dielectric layers 201a.

In this implementation, the supporting layer may be etched by a dry etching process. Specifically, the semiconductor structure is transferred into a reaction chamber, and the pressure in the reaction chamber is reduced by a vacuum system. After a vacuum state is reached, the reaction chamber is filled with a reactive gas. To etch tungsten and copper and other related conductive materials used in an integrated circuit, the reactive gas typically uses a mixture of nitrogen fluoride and oxygen. Alternatively, it may also use other fluorine (F)-containing gas as the etching gas, such as $CF_4$, $SF_6$ or $NF_3$. A power source creates an RF field through an electrode in the reaction chamber. The energy field excites the mixed gas into a plasma state. In the excited state, the reactive fluorine etches, and the material is converted into a volatile component and discharged by a vacuum system. Finally, other etching residues are removed. In this way, contact holes 300 exposing the surfaces of the conductive structures 200 (which is a buried word line) and surfaces of the sidewall dielectric layers 201a are formed.

Figure 8:
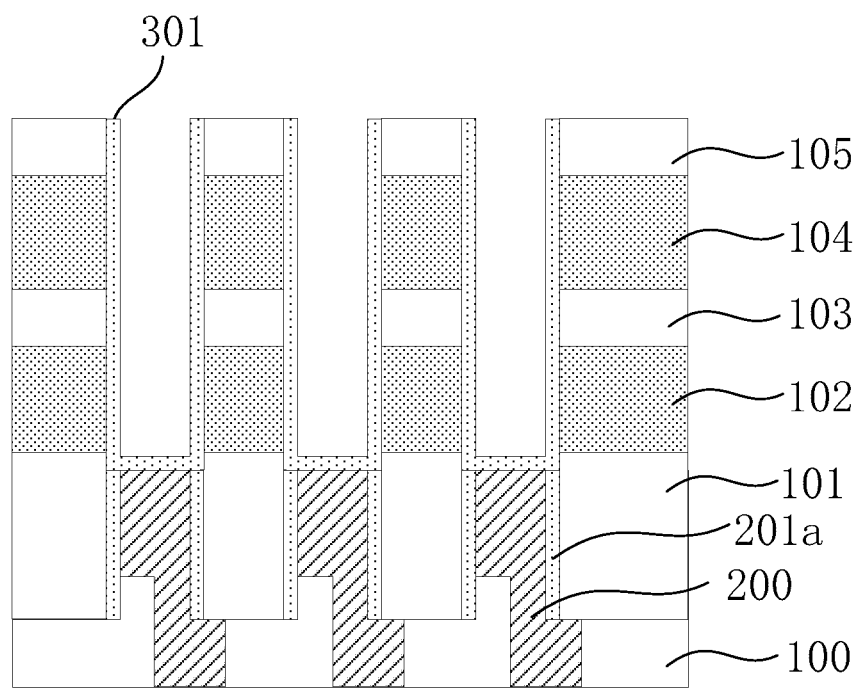

Step 6: Referring to FIG. 8, electrode layers 301 are formed on surfaces of the contact holes 300 respectively.

Specifically, electrode layers 301 are formed into the contact holes 300, and the contact holes 300 communicate with the surfaces of the etched conductive structures 200. In this implementation, electrode layers 301 are formed on the surfaces of the contact holes 300, by an ECP process.

The electrode layers 301 may be made of titanium nitride, which is the same as the sidewall dielectric layers 201a. The titanium nitride has a high melting point, a high hardness, a desirable high-temperature chemical stability, an excellent thermal and electrical conductivity, and it is suitable for the fields of high-temperature resistance and wear resistance.

Further, the electrode layers 301 and the sidewall dielectric layers 201a are subsequently connected as a whole, and together serve as a capacitor electrode of the semiconductor structure. The electrode layers 301 wrap around the periphery and the upper surface of the landing pad, which can increase the contact area between the capacitor and the landing pad and reduce the contact resistance there-between without increasing the size of the cylindrical capacitor. Meanwhile, this implementation is simple in process flow and is easy to operate.

Further, the electrode layer 301 and the sidewall dielectric layers 201a have the same deposition thickness. The electrode layer has a thickness of 20-50 nm. If the electrode layer is too thick, the conductivity will decrease; if the electrode layer is too thin, it may not be able to prevent the high temperature diffusion of tungsten.

Therefore, this implementation innovates and optimizes the semiconductor manufacturing process flow to improve the shape of the current capacitor contact structure and increase the contact area, so as to reduce the contact resistance of the capacitor and prevent two adjacent capacitors from short-circuiting due to high temperature diffusion between the conductive structures 200, thereby improving the yield of the semiconductor structure in the semiconductor manufacturing process.

An embodiment of the present disclosure further provides a semiconductor structure.

Figure 9:
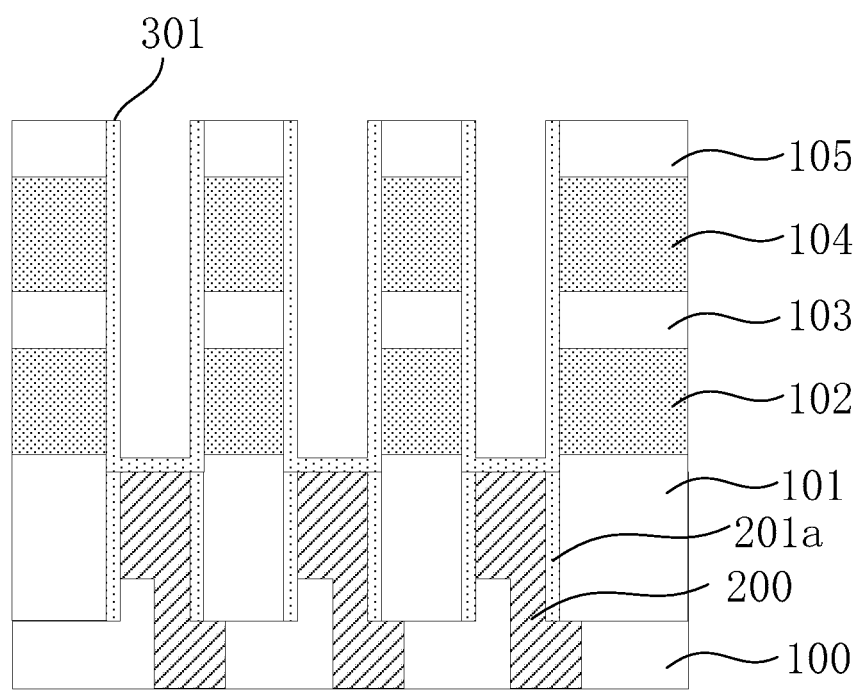
FIG. 9 is a cross-sectional view of a semiconductor structure according to an embodiment of the present disclosure.

FIG. 9 is a cross-sectional view of the semiconductor structure according to an embodiment of the present disclosure.

The semiconductor structure includes a semiconductor substrate 100, conductive structures 200, sidewall dielectric layers 201a, contact holes 300, a first supporting layer 101, a second sacrificial layer 102, a third supporting layer 103, a fourth sacrificial layer 104, a fifth supporting layer 105 and electrode layers 301.

A surface of the semiconductor substrate 100 is provided with a plurality of conductive structures 200 arranged at intervals, and the conductive structures 200 protrude from the semiconductor substrate 100.

The semiconductor substrate 100 may include, but is not limited to, a monocrystalline silicon substrate, a polycrystalline silicon substrate, a gallium nitride substrate or a sapphire substrate. In addition, when the semiconductor substrate 100 is a monocrystalline substrate or a polycrystalline substrate, it may also be an intrinsic silicon substrate or a doped silicon substrate. Further, it may be an N-type polycrystalline silicon substrate or a P-type polycrystalline silicon substrate.

The conductive structures 200 pass through the surface of the semiconductor substrate 100. The conductive structures 200 may be, but is not limited to, made of a conductive material such as tungsten and copper used in an integrated circuit.

Further, the conductive structures 200 are located on the surface of the semiconductor substrate 100 and have an offset characteristic. This characteristic ensures that the bottom conductive structure can be connected, and also ensures the close-packed arrangement of capacitor openings, thereby increasing the capacitor density and increasing the storage capacity of the capacitor per unit area.

Further, a part of the semiconductor substrate wraps a part of the conductive structures 200 to form isolation regions. In this implementation, the advantage of this process is that there is a layer of nitride between the tungsten structures to prevent the high temperature diffusion of tungsten from causing short circuit of two adjacent capacitors.

The sidewall dielectric layers 201a are located on sidewalls of the conductive structures 200. The sidewall dielectric layers 201a serve as a capacitor electrode. The sidewall dielectric layers 201a may be made of titanium nitride. According to material properties, the deposition thickness of the sidewall dielectric layers 201 may be 30-50 nm. The sidewall dielectric layers 201a are made of titanium nitride, which has a high melting point, a high hardness, a desirable high-temperature chemical stability, an excellent thermal and electrical conductivity, and it is suitable for the fields of high-temperature resistance and wear resistance.

The first supporting layer 101, the second sacrificial layer 102, the third supporting layer 103, the fourth sacrificial layer 104 and the fifth supporting layer 105 are sequentially deposited on the surface of the semiconductor substrate 100, the surfaces of the conductive structures 200 and upper surfaces of the sidewall dielectric layers 201a. Commonly used deposition materials include monocrystalline silicon, silicon oxynitride, silicon dioxide, silicon nitride and other related insulating materials used for isolating interconnection layers. For example, in this implementation, the first supporting layer 101 may be a silicon nitride layer, the second sacrificial layer 102 may be an oxide layer, the third supporting layer 103 may be a silicon nitride layer, the fourth sacrificial layer 104 may be an oxide layer, and the fifth supporting layer 105 may be a silicon nitride layer. In addition, according to material properties, the deposition thickness of the supporting layer and the sacrificial layer may be 30-120 nm (oxide layer) and 30-50 nm (silicon nitride layer).

In the actual process, as the depth of the capacitor increases, the number of supporting layers increases. The present disclosure can realize a capacitor structure with a single supporting layer or two or more supporting layers. Meanwhile, according to actual process requirements, the sacrificial layer may be etched away, and only the supporting layer is retained.

The contact holes 300 are located on the surface of the supporting layer and expose the conductive structures 200. Other etching residues are etched away to form the contact holes 300 exposing the surfaces of the conductive structures 200 and surfaces of the sidewall dielectric layers 201a.

The electrode layers 301 are formed on the surfaces of the contact holes 300 respectively. The electrode layers 301 may be made of titanium nitride, which is the same as the sidewall dielectric layers 201a. The titanium nitride has a high melting point, a high hardness, a desirable high-temperature chemical stability, an excellent thermal and electrical conductivity, and it is suitable for the fields of high-temperature resistance and wear resistance.

Further, the electrode layers 301 and the sidewall dielectric layers 201a are subsequently connected as a whole, and together serve as a capacitor electrode of the semiconductor structure. The electrode layers 301 wraps around the periphery and the upper surface of the landing pad, which can increase the contact area between the capacitor and the landing pad and reduce the contact resistance there-between without increasing the size of the cylindrical capacitor. Meanwhile, this implementation is simple in process flow and is easy to operate.

Further, each one of the electrode layers 301 and each one of the sidewall dielectric layers 201a have the same deposition thickness. Each one of the electrode layers has a thickness of 20-50 nm. If the electrode layers are too thick, the conductivity will decrease; if the electrode layers are too thin, it may not be able to prevent the high temperature diffusion of tungsten.

The capacitor of the DRAM is electrically connected to the landing pad through the lower electrode thereof and forms an access path with the drain of the transistor. In some structures with a landing pad, the sidewall dielectric layers 201a enlarge the cross-sectional area of the conductive structure, thereby increasing the contact area between the capacitor and the landing pad and reducing the resistance there-between. Therefore, by increasing the contact area between the capacitor and the landing pad, the present disclosure can reduce the resistance between the capacitor and the landing pad without increasing the size of the cylindrical capacitor, and can also avoid short circuit between two adjacent capacitors due to high temperature diffusion between the conductive structures 200. Therefore, the present disclosure can improve the yield of the semiconductor structure in the semiconductor manufacturing process.

The above described are merely preferred implementations of the present disclosure. It should be noted that several improvements and replacements may further be made by those of ordinary skill in the art without departing from the principle of the present disclosure, but such improvements and replacements should also be deemed as falling within the protection scope of the present disclosure.

What is claimed is:

1. A method of forming a semiconductor structure, comprising:
    providing a semiconductor substrate, wherein a surface of the semiconductor substrate is provided with a plurality of conductive structures arranged at intervals, and the conductive structures protrude from the semiconductor substrate;
    forming sidewall dielectric layers on sidewalls of the conductive structures respectively, and then depositing sequentially and alternately to form at least two supporting layers and sacrificial layers, wherein the at least two supporting layers are formed on the surface of the semiconductor substrate and surfaces of the conductive structures;
    etching the at least two supporting layers and the sacrificial layers to form contact holes penetrating through the at least two supporting layers and exposing top surfaces of the conductive structures and top surfaces of the sidewall dielectric layers; and
    forming electrode layers on surfaces of the contact holes respectively;
    wherein each one of the sidewall dielectric layers i.s made of titanium nitride and has a thickness of 30-50 nm.

2. The method of forming a semiconductor structure according to claim 1, wherein the forming sidewall dielectric layers on sidewalls of the conductive structures respectively comprises: depositing a dielectric layer on the surfaces of the conductive structures, and then etching the dielectric layer to form the sidewall dielectric layers.

3. The method of forming a semiconductor structure according to claim 1, wherein the at least two supporting layers and the sacrificial layers are respectively made of a material comprising silicon oxide, silicon nitride or silicon oxynitride.

4. The method of forming a semiconductor structure according to claim 1, further comprising: etching away the sacrificial layers.

5. The method of forming a semiconductor structure according to claim 2, wherein the etching the dielectric layer to form the sidewall dielectric layers comprises:
    etching the dielectric layer with a dielectric on the sidewalls of the conductive structures remained, to form the sidewall dielectric layers.

6. The method of forming a semiconductor structure according to claim 2, wherein, the electrode layers and the sidewall dielectric layers together serve as a capacitor electrode of the semiconductor structure.

7. The method of forming a semiconductor structure according to claim 2, wherein, each one of the electrode layers and each one of the sidewall dielectric layers have a same deposition thickness.

8. The method of forming a semiconductor structure according to claim 1, wherein, the providing a semiconductor substrate, wherein a surface of the semiconductor substrate is provided with a plurality of conductive structures arranged at intervals, comprises:
    depositing a barrier layer on the surface of the semiconductor substrate and the surfaces of the conductive structures.

9. A semiconductor structure, comprising:
    a semiconductor substrate, wherein a surface of the semiconductor substrate is provided with a plurality of conductive structures arranged at intervals, and the conductive structures protrude from the semiconductor substrate;
    sidewall dielectric layers, wherein the sidewall dielectric layers are respectively formed on sidewalls of the conductive structures;
    at least two supporting layers, wherein the at least two supporting layers are formed on the surface of the semiconductor substrate and surfaces of the conductive structures;
    contact holes, wherein the contact holes penetrate through the at least two supporting layers and expose top surfaces of the conductive structures and top surfaces of the sidewall dielectric layers; and
    electrode layers, wherein the electrode layers are respectively formed on surfaces of the contact holes;
    wherein each one of the sidewall dielectric lavers is made of titanium nitride and has a thickness of 30-50 nm.

10. The semiconductor structure according to claim 9, wherein each one of the conductive structures is made of a material comprising copper or tungsten.

11. The semiconductor structure according to claim 9, wherein each one of the electrode layers is made of titanium nitride and has a thickness of 20-50 nm.

12. The semiconductor structure according to claim 9, wherein each one of the at least two supporting layers is made of a material comprising silicon oxide, silicon tride, monociystalline silicon or silicon oxynitride.

* * * * *